United States Patent [19]

Wondra et al.

[11] Patent Number: 5,229,734
[45] Date of Patent: Jul. 20, 1993

[54] FILTER WITH ADJUSTABLE EDGE STEEPNESS

[75] Inventors: Jürgen Wondra, Baldham; Richard Stepp, Munich, both of Fed. Rep. of Germany

[73] Assignee: Siemens Aktiengesellschaft, Munich, Fed. Rep. of Germany

[21] Appl. No.: 919,067

[22] Filed: Jul. 23, 1992

[30] Foreign Application Priority Data

Jul. 31, 1991 [EP] European Pat. Off. ......... 91112907.0

[51] Int. Cl.⁵ .............................................. H03F 3/181
[52] U.S. Cl. .................................. 330/305; 330/126; 330/151; 330/306; 381/98
[58] Field of Search ............... 330/126, 151, 305, 306; 333/28 T; 381/98; 455/267; 307/521

[56] References Cited

U.S. PATENT DOCUMENTS 4,280,102 7/1981 Yokoyama ........................ 330/85
4,996,497 2/1991 Waehner ......................... 330/151

FOREIGN PATENT DOCUMENTS 2948755 7/1980 Fed. Rep. of Germany .
56-96518 8/1981 Japan .

OTHER PUBLICATIONS

"Electronique et Applications Industrielles" pp. 14 and 15 No. 257, Oct. 1978.
Siemens Aktiengesellschaft, 1983, pp. 142-145; Horst Pelka et al: "Analoge und Digitale IS".

*Primary Examiner*—James B. Mullins
*Attorney, Agent, or Firm*—Herbert L. Lerner; Laurence A. Greenberg

[57] ABSTRACT

A filter with adjustable edge steepness includes input terminals for applying a signal to be filtered. One of the input terminals is connected to a reference potential. A signal-forming device is connected to the input terminals for forming a first signal and a second signal from the signal to be filtered. The signal-forming device adjusts a difference between the first signal and the second signal. A subtraction device is connected to the signal-forming device for forming a differential signal from the first signal and the second signal. A frequency-dependent device has an input terminal connected to the subtraction device, an output terminal for supplying another signal, and a filter transfer characteristic to be delivered to the differential signal. An addition device has an output and is connected to the signal-forming device and to the output terminal of the frequency-dependent device for forming a summation signal at the output from the first signal and the other signal. One output terminal is connected to the output of the addition device and another output terminal is connected to the reference potential.

8 Claims, 4 Drawing Sheets

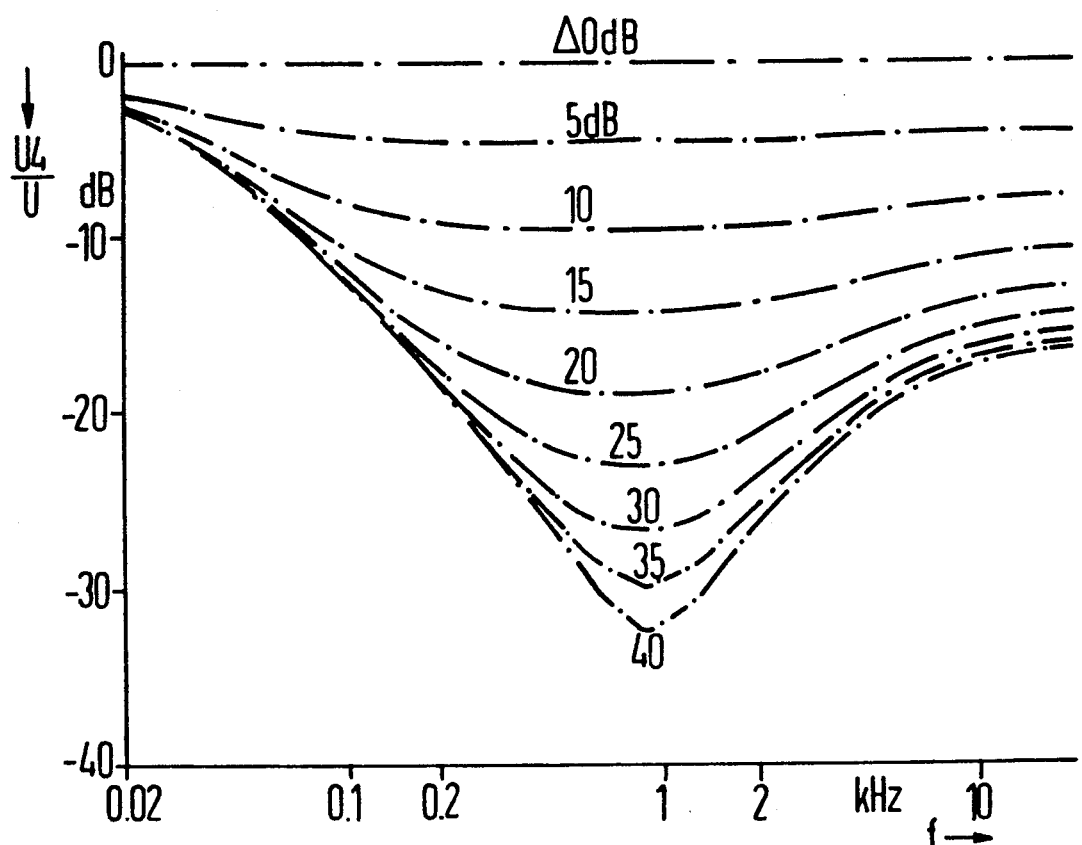
FIG 4
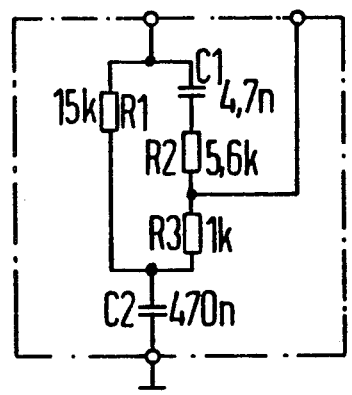

FILTER WITH ADJUSTABLE EDGE STEEPNESS

The invention relates to a filter with adjustable edge steepness.

Such filters are well-known and are used in the most various areas of electrical engineering. The book "Analoge und digitale IS" [Analog and Digital IC] by Horst Pelka and Klaus Wetzel, Siemens A.G., Berlin and Munich, 1983, pp. 143 and 144, describes a sound regulating circuit that includes the Siemens TDA 4290 integrated circuit. In that sound regulating circuit, the volume, and the treble and bass pitches can be regulated with direct voltage. The characteristic can be switched back and forth between linear amplifier control to physiological and thus audiologically correct volume control. In order to provide physiological volume control, the integrated circuit is externally wired to a frequency-dependent network that is activatable through a switch. The frequency-dependent network must be made symmetrically, without reference to ground. At the same time, the integrated circuit must provide three terminals for the physiological volume control, namely two for the frequency-dependent network and one for the switch device for activating the frequency-dependent network. FIG. 6.2 of the above-mentioned publication shows them as terminals 3, 4 and 6 of the TDA 4290 integrated circuit. A disadvantage of such sound regulating circuits is their high-impedance output and the sound characteristic "engraved" in the silicon.

A problem with a further sound regulating circuit made with a TDA 6200 is the linking of the volume adjustment to the treble and bass pitch control in the physiological volume control. This limits the freely available sound adjusting range.

It is accordingly an object of the invention to provide a filter with adjustable edge steepness, which overcomes the hereinafore-mentioned disadvantages of the heretofore-known devices of this general type. In particular, the frequency-dependent network of the filter should be connectable to an integrated circuit with only two terminals and should permit physiological volume control that is independent of the sound adjustment.

With the foregoing and other objects in view there is provided, in accordance with the invention, a filter with adjustable edge steepness, comprising input terminals for applying a signal to be filtered, one of the input terminals being connected to a reference potential; a signal-forming device connected to the input terminals for forming a first signal and a second signal from the signal to be filtered, the signal-forming device having means for adjusting a difference between the first signal and the second signal; a subtraction device connected to the signal-forming device for forming a differential or difference signal from the first signal and the second signal; a frequency-dependent device having an input terminal connected to the subtraction device, an output terminal for supplying another signal, and a filter transfer characteristic to be delivered to the differential signal; an addition device having an output, the addition device being connected to the signal-forming device and to the output terminal of the frequency-dependent device for forming a summation signal at the output from the first signal and the other signal; and output terminals, one of the output terminals being connected to the output of the addition device and the other of the output terminals being connected to the reference potential.

In accordance with another feature of the invention, the frequency-dependent device is a quadrupole having another input terminal and another output terminal, one of the output terminals and one of the input terminals being connected jointly to the reference potential.

In accordance with a further feature of the invention, the frequency-dependent device is a quadrupole having a transfer function:

$$H(s) = \frac{1}{1 + pRC}$$

where p is the Laplace constant, R is a resistance, and C is a capacitance.

In accordance with an added feature of the invention, the frequency-dependent device is a quadrupole having a transfer function:

$$H(s) = \frac{1 + Ap + Bp2}{1 + Cp + Dp2}$$

where A, B, C and D are constants, and p is the Laplace constant.

In accordance with an additional feature of the invention, there is provided an integrated circuit containing the signal-forming device, the subtracting device, the adding device and two terminals to be connected to the frequency-dependent device.

In accordance with a concomitant feature of the invention, the filter is used for the physiological volume control of audio signals.

The transfer function of a filter according to the invention derives from the ratio of output voltage $U_a$ to input voltage $U_e$. For instance, if a first signal U1 is used from the input signal $U_e$ to be filtered, and the first signal U1 is reduced by a factor K, as compared with $U_e$, and if the input signal $U_e$ is used as a second signal U2, then the transfer function of the filter is $$\frac{U_a}{U_e} = K \times (1 - H(s)) + H(s),$$

where H(s) designates the transfer function of the frequency-dependent device. The adjustable edge steepness of the filter is the result of the selection of the first and second input signals U1 and U2, having a frequency that can be freely defined by the user of the filter.

Other features which are considered as characteristic for the invention are set forth in the appended claims.

Although the invention is illustrated and described herein as embodied in a filter with adjustable edge steepness, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
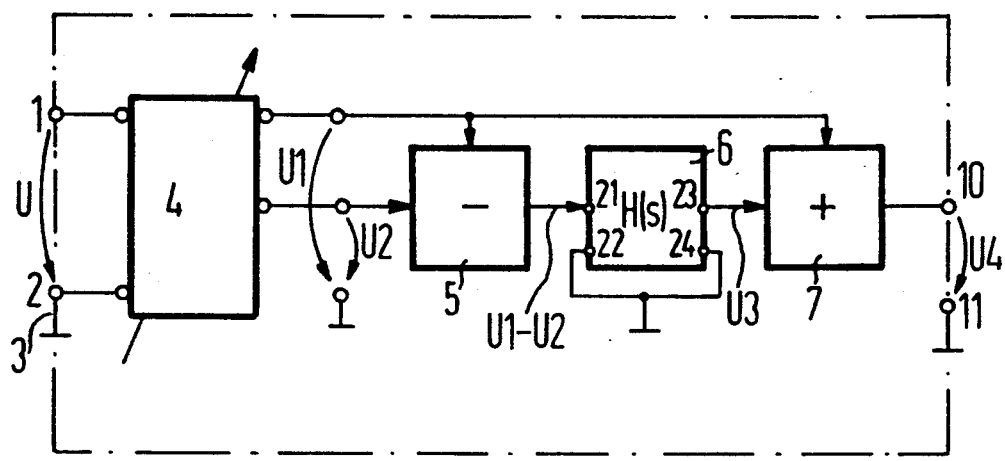
FIG. 1 is a basic block circuit diagram of a filter according to the invention.
Figure 2:
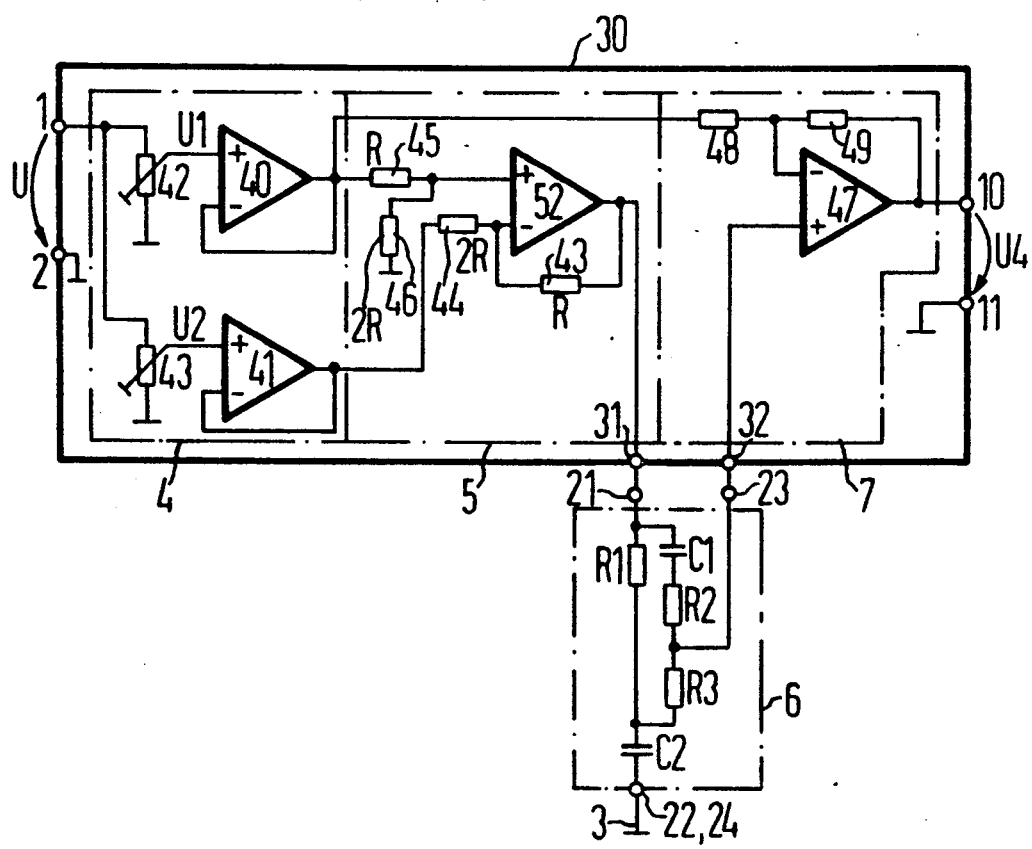
FIG. 2 is a block and schematic circuit diagram of the configuration of FIG. 1, in the form of an integrated circuit with a frequency-dependent device connectable thereto.
Figure 3:
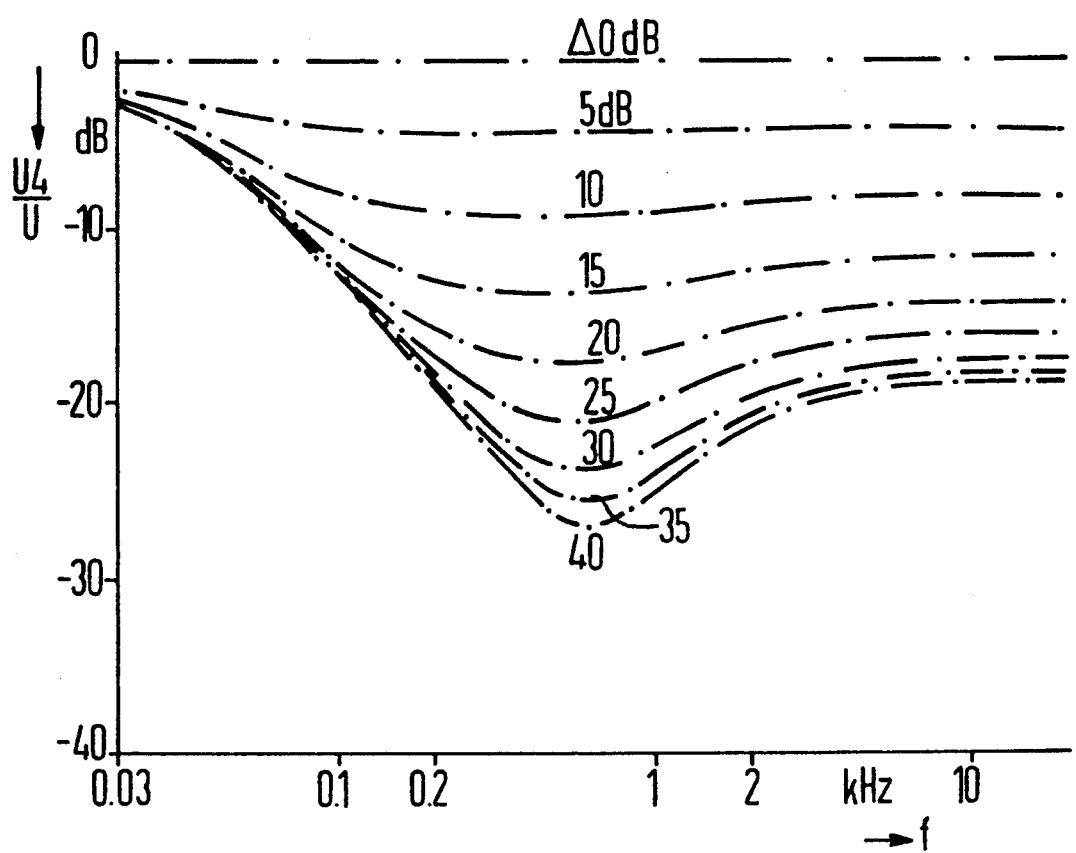
FIG. 3 is a graph showing a transfer function of a filter according to the invention as shown in FIGS. 1 and 2, with a schematic circuit diagram indicating a first possible dimensioning of the frequency-dependent device.
Figure 3:
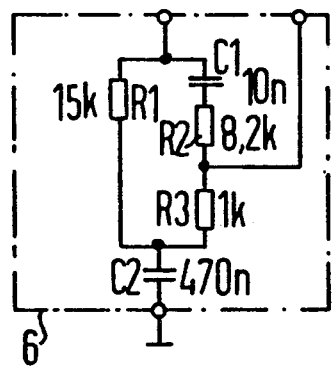
Figure 5:
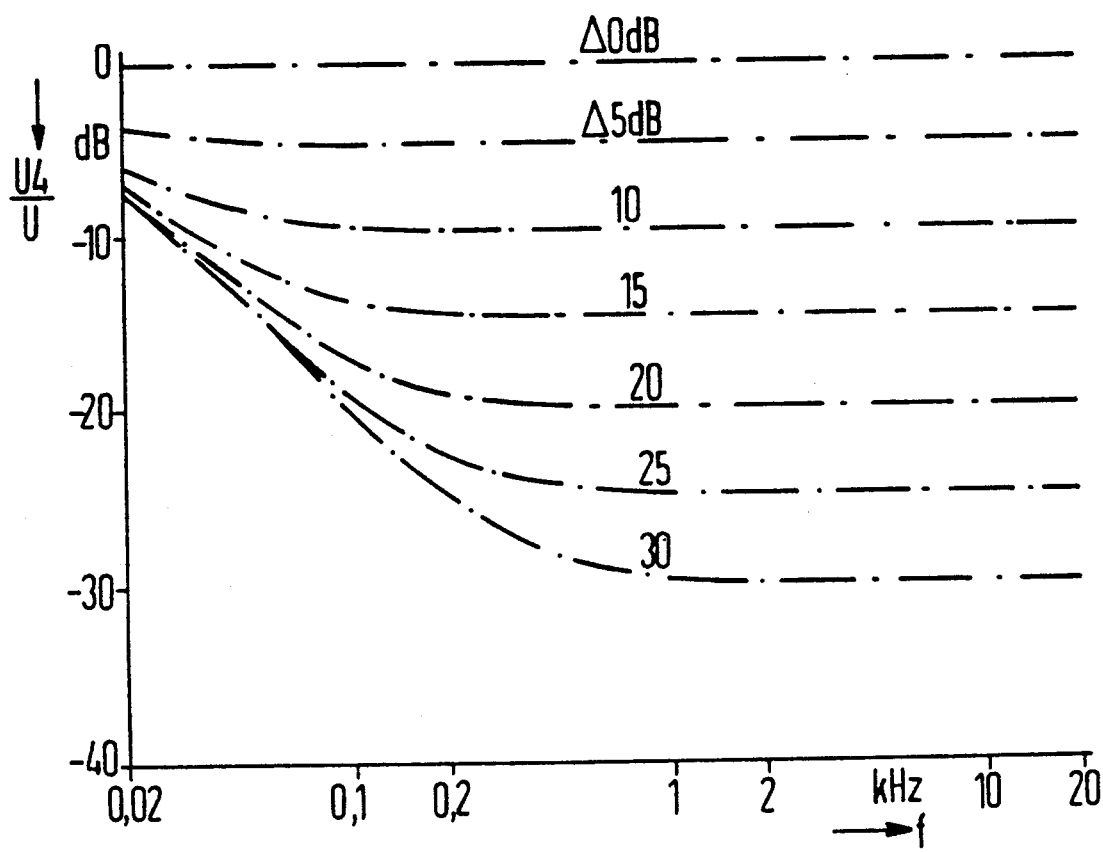
Figure 5:
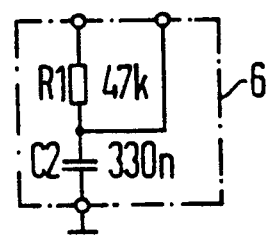

FIG. 4 is a view similar to FIG. 3 of a filter according to the invention as shown in FIGS. 1 and 2, with a schematic circuit diagram indicating a second possible dimensioning of the frequency-dependent device; and FIG. 5 is a view similar to FIGS. 3 and 4 of a filter according to the invention as shown in FIGS. 1 and 2, with a schematic circuit diagram indicating dimensioning of a resistor-capacitor (RC) combination of a frequency-dependent device.

Referring now to the figures of the drawing in detail and first, particularly, to FIG. 1 thereof, there is seen a block circuit diagram of a filter according to the invention with adjustable edge steepness. The filter has:

input terminals 1, 2 for applying a signal U to be filtered, with one input terminal 2 being connected to a reference potential 3;

a device 4 for forming a first signal U1 from the signal U to be filtered as well as for forming a second signal U2 from the signal U to be filtered, wherein a difference between the first signal U1 and the second signal U2 is adjustable;

a subtraction device 5 for forming a differential signal U1
·U2 from the first signal U1 and the second signal U2;

a frequency-dependent device 6 having a filter transfer characteristic H(s) that can be delivered to the differential signal U1–U2;

an addition device 7 for forming a summation signal U4 from the first signal U1 and a signal U3 that can be picked up at an output 23 of the frequency-dependent device 6; and output terminals 10, 11, including one output terminal 10 connected to an output of the addition device 7, and another output terminal 11 connected to the reference potential 3.

The adjustability of the difference between the first signal U1 and the second signal U2 is represented in FIG. 1 by the arrow at the device 4. As will be explained in further detail below in conjunction with FIGS. 3 to 5, a different transfer characteristic of the filter, which is especially suitable for physiological volume control, is obtained depending on the difference selected between the first signal U1 and the second signal U2.

The frequency-dependent device 6 is constructed as a quadrupole having two input terminals 21, 22 and two output terminals 23, 24. One output terminal 24 and one input terminal 22 are connected jointly to the reference potential 3.

FIG. 2 shows an exemplary embodiment of an integrated circuit 30, with which the device 4 for forming the first signal U1 and the second signal U2, the subtraction device 5 and the addition device 7 are integrated. The device 4 has two parallel-connected operational amplifiers 40, 41, being connected as voltage followers and respectively receiving the first signal U1 and the second signal U2 through variable resistors 42, 43. Through the use of the variable resistors 42, 43, the first signal U1 and the second signal U2 are recovered from the signal U that is applied to the terminals 1 and 2 and is to be filtered. The subtraction device 5 has an operational amplifier 52, which is connected as an inverting amplifier. To that end, the output of the operational amplifier 52 is connected to its negative or inverting input through a resistor 43. The negative or inverting input of the operational amplifier 52 is at the same time connected through a further resistor 44 to the output of the operational amplifier 41 at which the second signal U2 can be picked up. The positive o non-inverting input of the operational amplifier 52 is connected through a further resistor 45 to the output of the operational amplifier 40, at which the first signal U1 can be picked up. At the same time, the positive or non-inverting input of the operational amplifier 52 is connected to reference potential through a further resistor 46. The operational amplifier 52 thus acts as a subtraction device. The resistance ratios of the resistors 46 to 45 and 43 to 44 are preferably selected to be same. In this exemplary embodiment, the resistance of each of the resistors 45 and 43 is R, and the resistance of each of the resistors 44 and 46 is 2R.

On the output side, the operational amplifier 52 of the subtraction device 5 is connected to a terminal 31 of the integrated circuit 30. The integrated circuit of FIG. 2 also has a further terminal 32. This terminal 32 is connected to a positive or non-inverting input of a operational amplifier 47 that is wired as the addition device 7. The negative or inverting input of this operational amplifier 47 is connected to a connecting point between two resistors 48, 49. The resistor 48 is located between the output of the operational amplifier 40 and the negative or inverting input of the operational amplifier 47. The resistor 49 is connected between the negative or inverting input and the output of the operational amplifier 47. The output of the operational amplifier 47 is connected to the output terminal 10 of the filter. The output terminal 11 is connected to reference potential.

The integrated circuit 30 thus includes the device 4 for forming the first signal U1 and the second signal U2, the subtraction device 5, and the addition device 7. In order to make the filter according to the invention, the frequency-dependent device 6 is connected to the terminals 31 and 32 of the integrated circuit 30.

In the exemplary embodiment of FIG. 2, the frequency-dependent device 6 is constructed in such a way that a resistor R1 and a capacitor C2 are connected in series between the terminal 31 of the integrated circuit 30 and the reference potential 3. A series circuit of a capacitor C1, a resistor R2 and a further resistor R3 is connected parallel to the resistor R1. A connecting point between the resistor R2 and the resistor R3 is connected to the output terminal 23 of the frequency-dependent device 6. This output terminal 23 is connected to the terminal 32 of the integrated circuit 30. The input terminal 21 of the frequency-dependent device 6 is connected on one hand to the terminal 31 of the integrated circuit 30 and on the other hand to the resistor R1 and the capacitor C1. The capacitor C2 is connected to the other input terminal 22 and to the other output terminal 24, which are shown as only a single terminal in FIG. 2, for the sake of simplicity.

If the dimensions of the circuit elements R1, R2, R3, C1 and C2 are as follows:
R1=15 kOhm,
R2=8.2 kOhm,
R3=1 kOhm,
C1=10 nF,
C2=470 nF, then a transfer function as shown in FIG. 3 results for the filter according to the invention. In FIG. 3, the frequency f is plotted on a logarithmic scale on the abscissa and the transfer function is plotted on the ordinate, and thus the ratio between the summation or output signal U4 and the input signal U of the filter is plotted in dB. The transfer function is shown as a function of the differential signal U1

U2 and specifically, it is shown for the differential signals 0 dB, 5 dB, 10 dB, 15 dB, 20 dB, 25 dB, 30 dB, 35 dB, and 40 dB.

In FIG. 4, a transfer function of a filter according to the invention is again shown. In FIG. 4, basically the same circuit configuration as in FIG. 3 or FIG. 2 is used for the frequency-dependent device 6. Only the capacitor C1 and the resistor R2 are dimensioned differently in comparison with FIG. 3. In FIG. 4 the capacitor C1 has a capacitance of 4.7 nF and the resistor R2 has a resistance of 5.6 kOhm. With these dimensions, the transfer characteristic that is obtained is as shown at the top of FIG. 4, from which it can clearly be seen that the volume reduction in the 1 kHz range is greater than in FIG. 3.

In FIG. 5, only an RC element having the resistor R1 and the capacitor C2 is presented as the frequency-dependent device 6. The resistor R1 and the capacitor C1 are connected in series between the input terminal 21 and the reference potential 3. The output terminal 23 of the frequency-dependent device is connected to the connecting point between the resistor R1 and the capacitor C2, and the capacitor is connected to the reference potential. The resistor R1 has a resistance of 47 kOhm and the capacitor C2 has a capacitance of 33 nF. When this kind of frequency-dependent device 6 is used, the transfer characteristic shown at the top of FIG. 5 results.

It should also be noted that as the frequency-dependent device 6 in FIGS. 2, 3 and 4, a quadrupole is used that can be generally expressed by the transfer function:

$$H(s) = \frac{1 + Ap + Bp2}{1 + Cp + Dp2}$$

where A, B, C and D are constants, and p is the Laplace constant.

The frequency-dependent device of FIG. 5, expressed generally, has the following transfer function:

$$H(s) = \frac{1}{1 + pRC}$$

where p is again the Laplace constant, R is a resistance and C is a capacitance.

The filter according to the invention can advantageously be employed for physiological volume control of audio signals. In contrast to the physiological volume controls previously known, the volume control herein is no longer influenced by the sound control. Moreover, an asymmetrical device, that is one with a connection to reference potential, can be provided as the frequency-dependent device. In addition, it is sufficient, as shown in FIG. 2, for two terminals in the integrated circuit to be furnished for connecting the frequency-dependent network to the integrated circuit.

We claim:

1. A filter with adjustable edge steepness, comprising:
input terminals for applying a signal to be filtered, one of said input terminals being connected to a reference potential;
a signal-forming device connected to said input terminals for forming a first signal and a second signal from the signal to be filtered, said signal-forming device having means for adjusting a difference between the first signal and the second signal;
a subtraction device connected to said signal-forming device for forming a differential signal from the first signal and the second signal;
a frequency-dependent device having an input terminal connected to said subtraction device, an output terminal for supplying another signal, and a filter transfer characteristic to be delivered to the differential signal;
an addition device having an output, said addition device being connected to said signal-forming device and to said output terminal of said frequency-dependent device for forming a summation signal at said output from the first signal and the other signal; and
output terminals, one of said output terminals being connected to said output of said addition device and the other of said output terminals being connected to the reference potential.

2. The filter according to claim 1, wherein said frequency-dependent device is a quadrupole having another input terminal and another output terminal, one of said output terminals and one of said input terminals being connected jointly to the reference potential.

3. The filter according to claim 2, wherein said frequency-dependent device has a transfer function:

$$H(s) = \frac{1}{1 + pRC}$$

where p is the Laplace constant, R is a resistance, and C is a capacitance.

4. The filter according to claim 2, wherein said frequency-dependent device has a transfer function:

$$H(s) = \frac{1 + Ap + Bp2}{1 + Cp + Dp2}$$

where A, B, C and D are constants and p is the Laplace constant.

5. The filter according to claim 1, wherein said frequency-dependent device is a quadrupole having a transfer function:

$$H(s) = \frac{1}{1 + pRC}$$

where p is the Laplace constant, R is a resistance, and C is a capacitance.

6. The filter according to claim 1, wherein said frequency-dependent device is a quadrupole having a transfer function:

$$H(s) = \frac{1 + Ap + Bp2}{1 + Cp + Dp2}$$

where A, B, C and D are constants, and p is the Laplace constant.

7. The filter according to claim 1, including an integrated circuit containing said signal-forming device, said subtracting device, said adding device and two terminals to be connected to said frequency-dependent device.

8. A filter with adjustable edge steepness for the physiological volume control of audio signals, comprising:

input terminals for applying a signal to be filtered, one of said input terminals being connected to a reference potential;

a signal-forming device connected to said input terminals for forming a first signal and a second signal from the signal to be filtered, said signal-forming device having means for adjusting a difference between the first signal and the second signal;

a subtraction device connected to said signal-forming device for forming a differential signal from the first signal and the second signal;

a frequency-dependent device having an input terminal connected to said subtraction device, an output terminal for supplying another signal, and a filter transfer characteristic to be delivered to the differential signal;

an addition device having an output, said addition device being connected to said signal-forming device and to said output terminal of said frequency-dependent device for forming a summation signal at said output from the first signal and the other signal; and output terminals, one of said output terminals being connected to said output of said addition device and the other of said output terminals being connected to the reference potential.

* * * * *